United States Patent
Nozawa

[11] Patent Number: 5,898,531
[45] Date of Patent: *Apr. 27, 1999

[54] SIGNAL PROCESSING APPARATUS FOR DIGITALLY MODULATING INPUT DATA

[75] Inventor: Shingo Nozawa, Yokohama, Japan

[73] Assignee: Cannon Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/520,673

[22] Filed: Aug. 29, 1995

[30] Foreign Application Priority Data

Sep. 1, 1994  [JP]  Japan .................................. 6-208552

[51] Int. Cl.⁶ .............................. G11B 20/06; G11B 5/09
[52] U.S. Cl. ............................... 360/30; 360/41; 375/295
[58] Field of Search ................................ 360/29, 30, 39, 360/41, 40; 341/68, 58; 327/64; 326/52; 375/242, 295

[56] References Cited

U.S. PATENT DOCUMENTS

| | | | |
|---|---|---|---|
| 4,907,092 | 3/1990 | Iwase et al. ............................. | 360/29 |
| 5,432,651 | 7/1995 | Maeno et al. ............................ | 360/40 |
| 5,546,427 | 8/1996 | Shimada et al. ........................ | 360/41 |
| 5,642,241 | 6/1997 | Kim ......................................... | 360/45 |
| 5,712,861 | 1/1998 | Inoue et al. ............................ | 371/37.1 |

*Primary Examiner*—Aristotelis M. Psitos
*Assistant Examiner*—Regina Y. Neal
*Attorney, Agent, or Firm*—Fitzpatrick, Cella Harper & Scinto

[57] ABSTRACT

Input data is modulated, a two-valued signal regarding a signal of a specific frequency is generated, and a logical arithmetic operation between the modulation data and the two-valued signal is executed. In accordance with the result of the logical arithmetic operation, the specific frequency component in the modulation data is detected. The modulating operation is controlled in accordance with the detection result. As mentioned above, the specific frequency component in the modulation data is detected by the logical arithmetic operation between the modulation data and the two-valued signal. By controlling the modulator on the basis of the detection result, the specific frequency component in the modulation data can be detected by a simple construction. For example, an amount of specific frequency component in the modulation data can be adjusted.

39 Claims, 13 Drawing Sheets

TAPE TRAVELING DIRECTION

FIG. 7A  TWO-VALUED SIN

FIG. 7B  TWO-VALUED COS

TWO-VALUED SIGNAL

SELECTION SIGNAL

SIN

COS

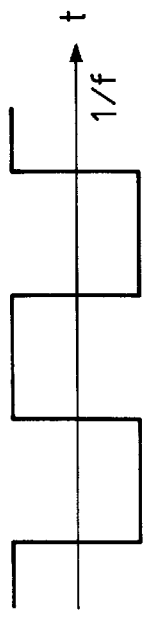
FIG. 14A — TWO-VALUED SIN
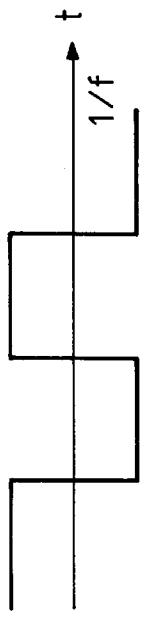
FIG. 14B — TWO-VALUED COS
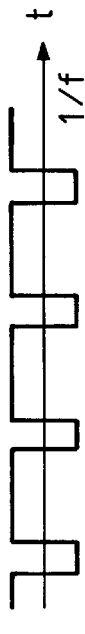
FIG. 14C — SELECTION 1
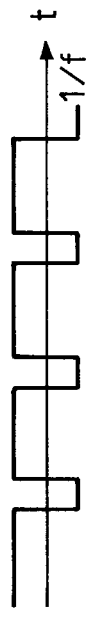
FIG. 14D — SELECTION 2
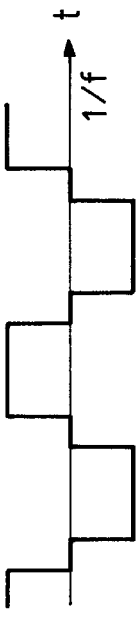
FIG. 14E — THREE-VALUED SIN
FIG. 14F — THREE-VALUED COS

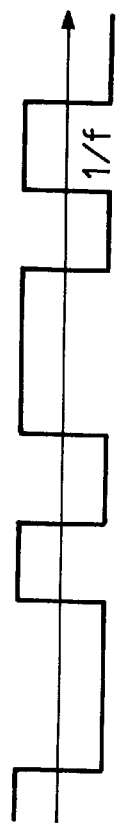
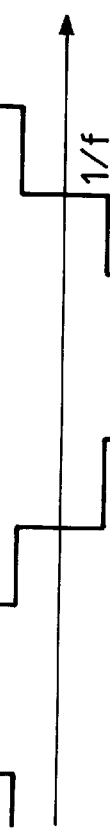
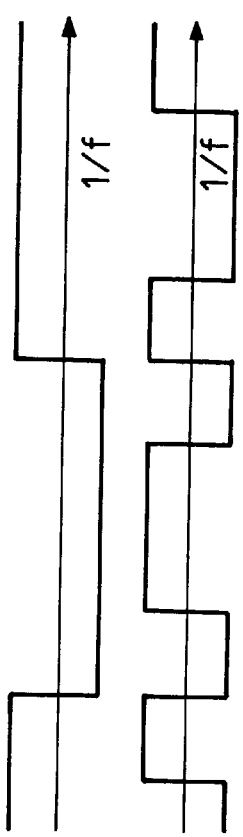
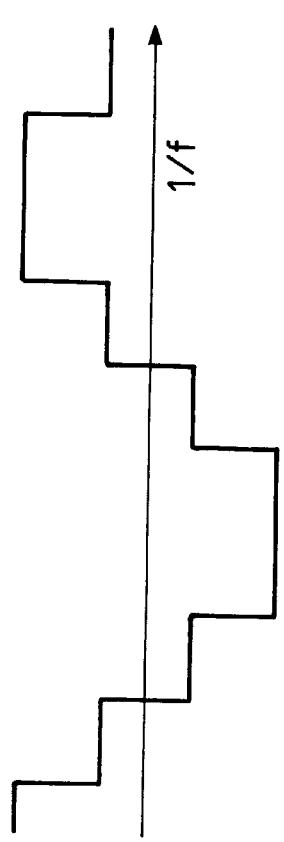
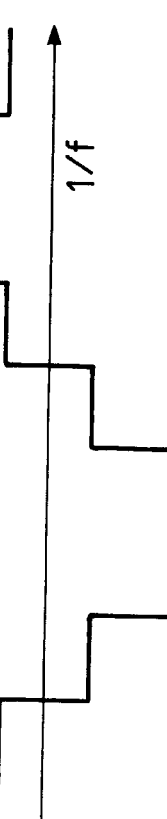
FIG. 16A  FOUR-VALUED 0°-x
FIG. 16B  FOUR-VALUED 0°-y
FIG. 16C  FOUR-VALUED 0°
FIG. 16D  FOUR-VALUED 90°-x
FIG. 16E  FOUR-VALUED 90°-y
FIG. 16F  FOUR-VALUED 90°

SIGNAL PROCESSING APPARATUS FOR DIGITALLY MODULATING INPUT DATA

BACKGROUND OF THE INVENTION

1. Field of the Invention

The invention relates to a signal processing apparatus and, more particularly, to an apparatus for digitally modulating input data and outputting the modulated data.

2. Related Background Art

As such a kind of apparatus, hitherto, there has been known, for example, a digital VTR for recording and reproducing a digital signal to/from a recording medium.

In such a digital VTR, particularly, in a digital VTR for industrial use, when a digital signal is recorded to a magnetic tape, it is necessary to raise a recording density by narrowing a track width as much as possible or the like and thereby to reduce a consumption amount of the magnetic tape. As a result, the recording track width is narrowed as mentioned above, and in order to correctly reproduce a recording signal, what is called a tracking for allowing a head to accurately trace the recording track is important.

An apparatus for multiplexing a pilot signal to a recording signal for tracking in a digital VTR to a recording signal is disclosed in Japanese Patent Application Laid-Open No. 4-255969.

FIG. 1 is a block diagram showing a conventional construction of such a kind of apparatus for multiplexing the pilot signal to the recording signal.

In FIG. 1, a recording signal subjected to predetermined processes is inputted from an input terminal 1 and a code "1" or "0" is added to recording data of (n) bits by a modulation circuit 2, thereby converting to two kinds of data of (n+1) bits. Those two kinds of modulation data are respectively outputted to correlation detection circuits 4 and 7. A correlation between each modulation data and a pilot signal to be multiplexed having a predetermined frequency (f) is detected. Signals according to such correlations are respectively outputted to a selection circuit 11.

Specifically speaking, in the correlation detection circuit 4, a sine wave signal (hereinafter, "sine" is simply referred to as a "sin") from a sin wave signal generation circuit 61 and a cosine wave signal (hereinafter, "cosine" is also simply referred to as a "cos") from a cos wave signal generation circuit 51 are respectively multiplied by the inputted recording data and results of the multiplications are added, thereby detecting a correlation. Components in the case where the pilot signal of the frequency (f) is separated to a sin component and a cos component are respectively outputted as multivalues from the sin wave signal generation circuit 61 and cos wave signal generation circuit 51.

The selection circuit 11 controls a switch 3 so as to select the modulation data having a higher correlation on the basis of a signal indicative of the correlation outputted from each correlation detection circuit.

By modulating the recording data as mentioned above, the pilot signal component of the frequency (f) is multiplexed.

In the conventional apparatus as mentioned above, however, when the correlation between each modulation data and the pilot signal is detected, the multiplications of the multivalues of the sin wave and cos wave are executed, so that there is a drawback such that multipliers and adders of large digit numbers are necessary and a circuit scale increases.

There is also a drawback such that a data amount of the correlation values obtained and a scale of a circuit to compare the correlation values is large.

SUMMARY OF THE INVENTION

It is an object of the invention to solve the problems as mentioned above.

Another object of the invention is to enable a specific frequency component in modulation data to be detected by a simple construction.

Under such objects, according to the invention, as one embodiment, there is provided a data processing device comprising modulating means for modulating input data, generating means for generating a two-valued signal regarding a signal of a specific frequency, operating means for executing a logical arithmetic operation between output data of the modulating means and the two-valued signal, detecting means for detecting the specific frequency component in the output data of the modulating means in accordance with an output of the operating means and control means for controlling the operation of the modulating means in accordance with an output of the detecting means.

Still another object of the invention is to enable a correlation between a signal of a specific frequency and input data to be easily and accurately detected.

The above and other objects and features of the present invention will become apparent from the following detailed description and the appended claims with reference to the accompanying drawings.

BRIEF DESCRIPTION OF THE DRAWINGS

FIGS. 14A to 14F are diagrams showing states of signals which are used in the circuit of FIG. 13;

FIGS. 16A to 16F are diagrams showing states of signals which are used in the circuit of FIG. 15.

DETAILED DESCRIPTION OF THE PREFERRED EMBODIMENTS

An embodiment of the present invention will now be described in detail hereinbelow with reference to the drawings.

Figure 1:
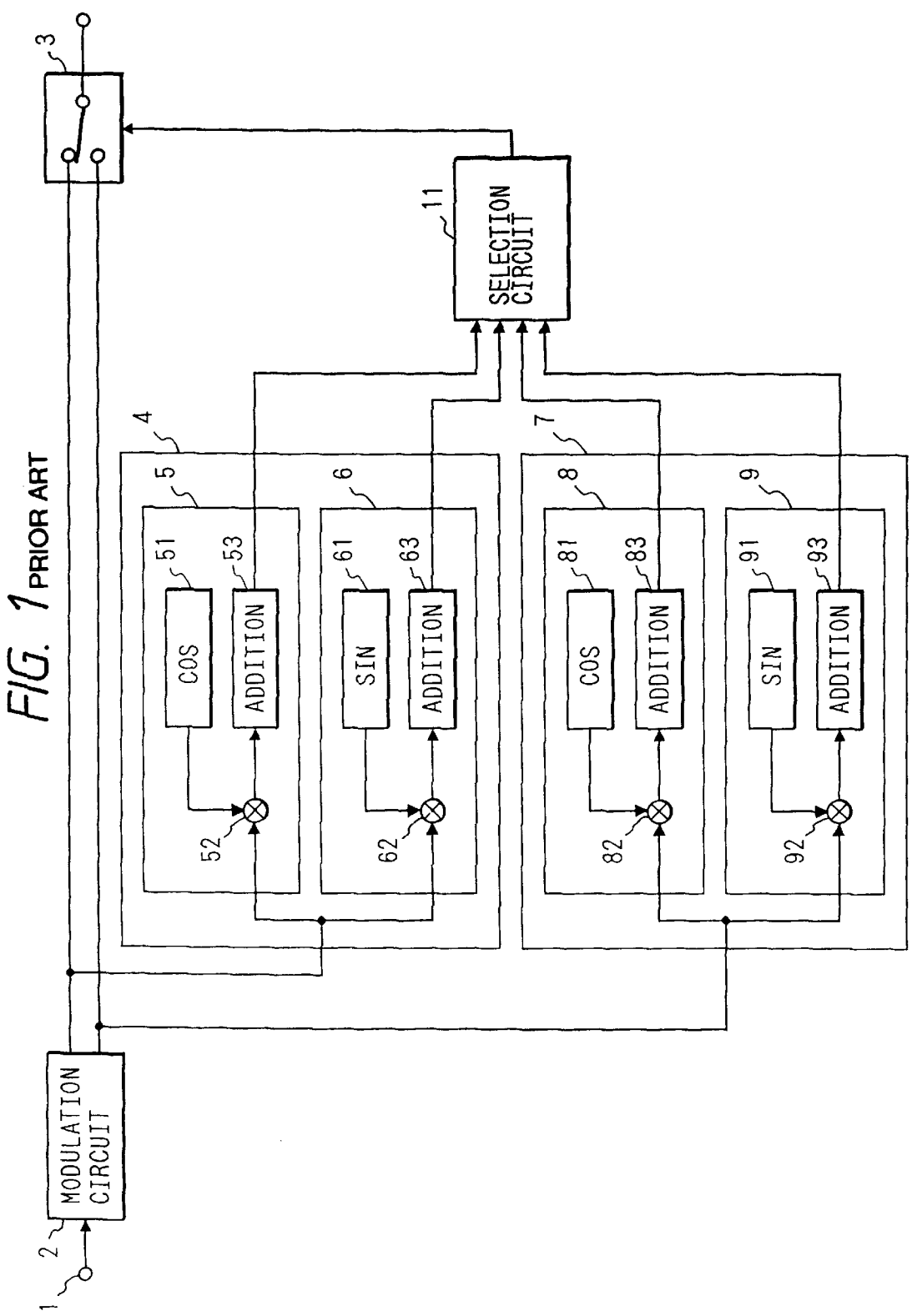
FIG. 1 is a diagram showing a construction of a conventional apparatus.
Figure 2:
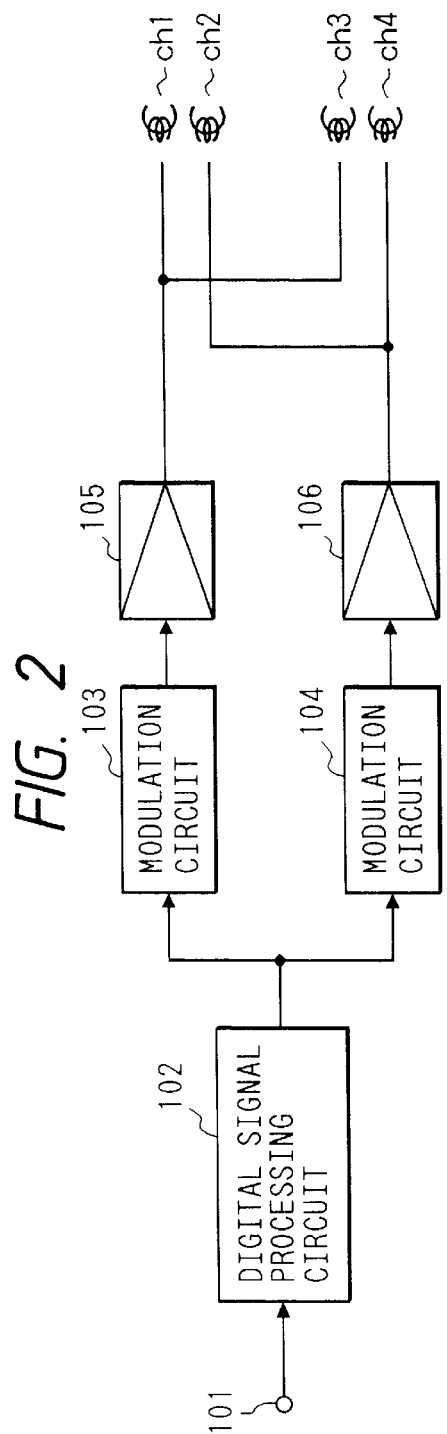
FIG. 2 is a block diagram showing a construction of a digital VTR according to an embodiment of the invention.

The embodiment will be explained with respect to the case where the invention is applied to a digital VTR. FIG. 2 is a block diagram showing a schematic construction of a recording system of a digital VTR for multiplexing a pilot signal for a tracking control and recording according to the invention.

In the diagram, reference numeral 101 denotes an input terminal to which a digital signal including a video signal, an audio signal, and the like is inputted. Reference numeral 102 denotes a digital signal processing circuit for executing an encoding, an addition of an ID code, a sync code, an error correction code, etc., and the like to the digital signal inputted from the input terminal 101. In the embodiment, it is assumed that the data of 24 bits in which data of one word and eight bits is simultaneously outputted every three words is outputted in parallel from the digital signal processing circuit 102.

The 24-bit data is respectively supplied to modulation circuits 103 and 104. The modulation circuits 103 and 104 convert the 24-bit data to 25-bit data having different bit patterns, respectively, and adjust amounts of components of predetermined frequencies f1 and f2 and a DC component when those data groups are returned to bit streams as will be explained hereinlater and generate the adjusted resultant data.

The modulation circuit 103 generates the bit stream in which each component of f1, f2, and DC is suppressed. Similarly, the modulation circuit 104 suppresses each component of f1, f2, and DC and also generates a bit stream having the component of f1 or f2.

In FIG. 2, reference numerals 105 and 106 denote recording amplifiers. The bit streams which are outputted from the modulation circuits 103 and 104 are inputted to heads ch1 and ch3 and heads ch2 and ch4 through the recording amplifiers 105 and 106, respectively.

Figure 3:
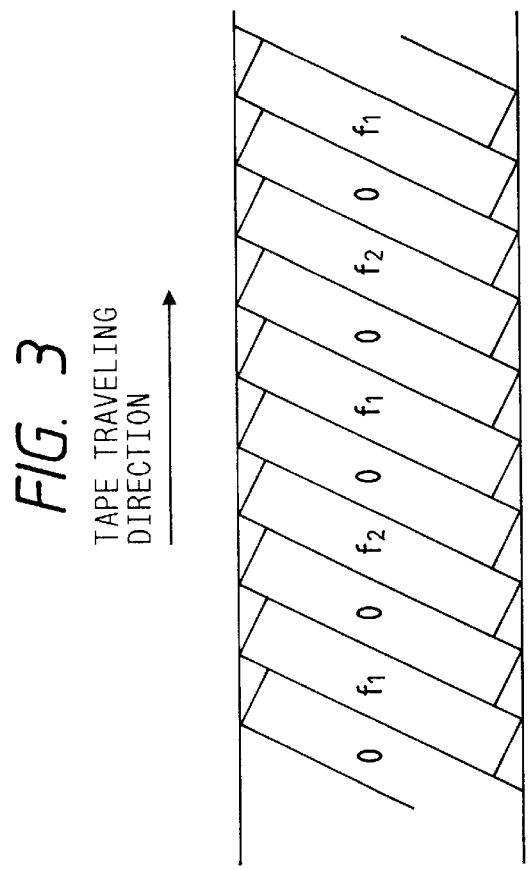
FIG. 3 is a diagram showing a state of tracks which are recorded on a magnetic tape by the apparatus of FIG. 2.

FIG. 3 shows a state of tracks which are formed on the tape by the heads ch1 to ch4.

In FIG. 3, f1 denotes a track in which a signal which has the component of f1 as a pilot signal and in which the f2 component and DC component are suppressed is recorded. f2 denotes a track in which a signal which has the component of f2 as a pilot signal and in which the f1 component and DC component are suppressed is recorded. Further, a signal in which all of the f1 and f2 components and the DC component are suppressed is recorded in a track shown by "0".

Every two tracks are simultaneously formed by the heads ch1 to ch4 in FIG. 2.

The modulation circuits 103 and 104 in FIG. 2 according to the first embodiment of the invention will now be described.

Figure 4:
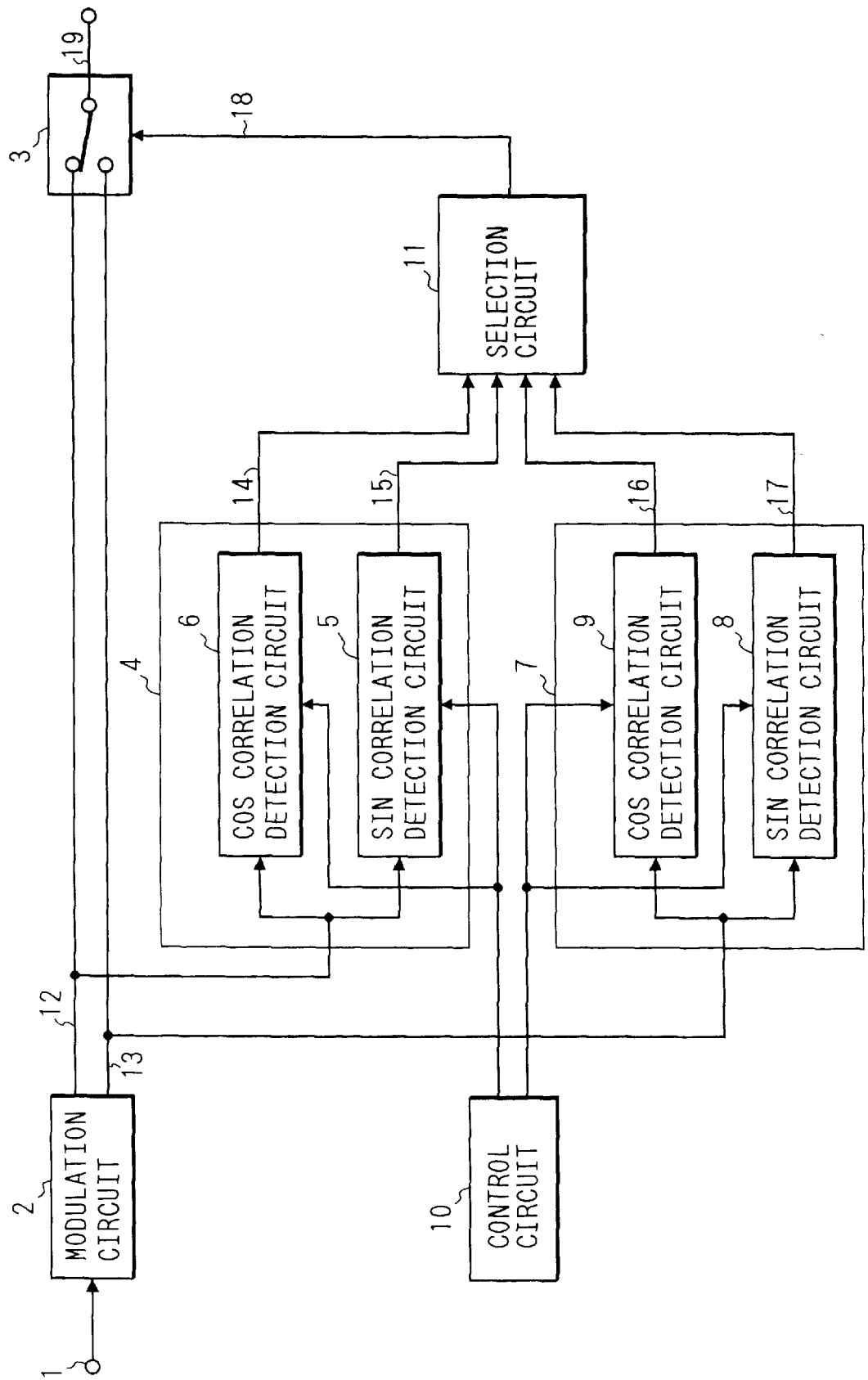
FIG. 4 is a diagram showing a construction of a modulation circuit in FIG. 2.

FIG. 4 is a block diagram showing a construction of the modulation circuits 103 and 104. In FIG. 4, the data outputted from the digital signal processing circuit 102 is inputted every 24 bits from the input terminal 1 and is converted to two kinds of 25-bit data by the modulation circuit 2. The 25-bit data is respectively outputted to the correlation detection circuits 4 and 7.

Figure 5:
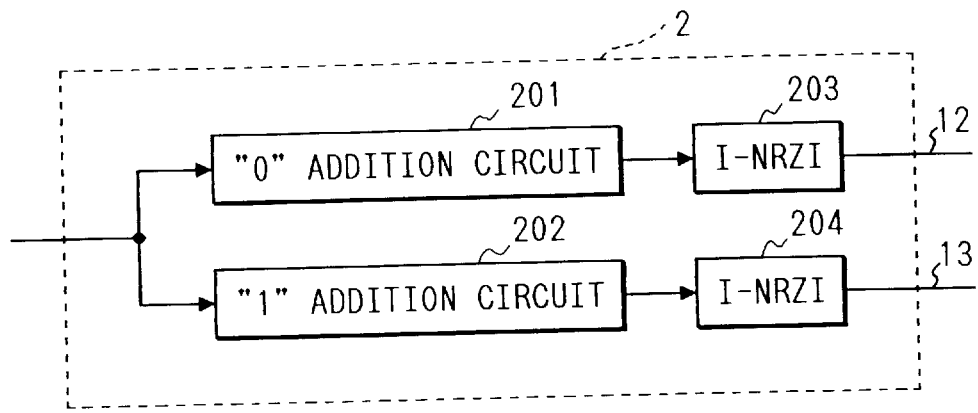
FIG. 5 is a diagram showing a construction of a modulation circuit in FIG. 4.

FIG. 5 shows a specific constructional example of the modulation circuit 2. In FIG. 5, the input data is respectively inputted to a "0" addition circuit 201 and a "1" addition circuit 202. A control bit 0 or 1 is added to the head of each 24-bit data and the resultant data is outputted to interleaved NRZI (hereinafter, simply referred to as I-NRZI) circuits 203 and 204. In the embodiment, the I-NRZI circuits are circuits for getting the exclusive OR between the odd-number bits and between the even-number bits, namely, every other bit with respect to each of the 25-bit data. As such a modulating method, any method can be applied to the embodiment so long as a modulating method whereby at least partial data in each word has an opposite relation in dependence on whether the control bit is equal to "0" or "1".

The I-NRZI circuits 203 and 204 convert the 25-bit data added with "0" and "1" to the I-NRZI modulated 25-bit data and output them.

The data modulated by the modulation circuit 2 as mentioned above is outputted to the correlation detection circuits 4 and 7, respectively. The correlation detection circuit 4 is a circuit to detect a correlation between the data that was added with the control bit "0" and was modulated by the modulation circuit 2 and the pilot signal to be multiplexed. The correlation detection circuit 7 is a circuit to detect a correlation between the data that was added with the control bit "1" and was modulated and the pilot signal.

Figure 6:
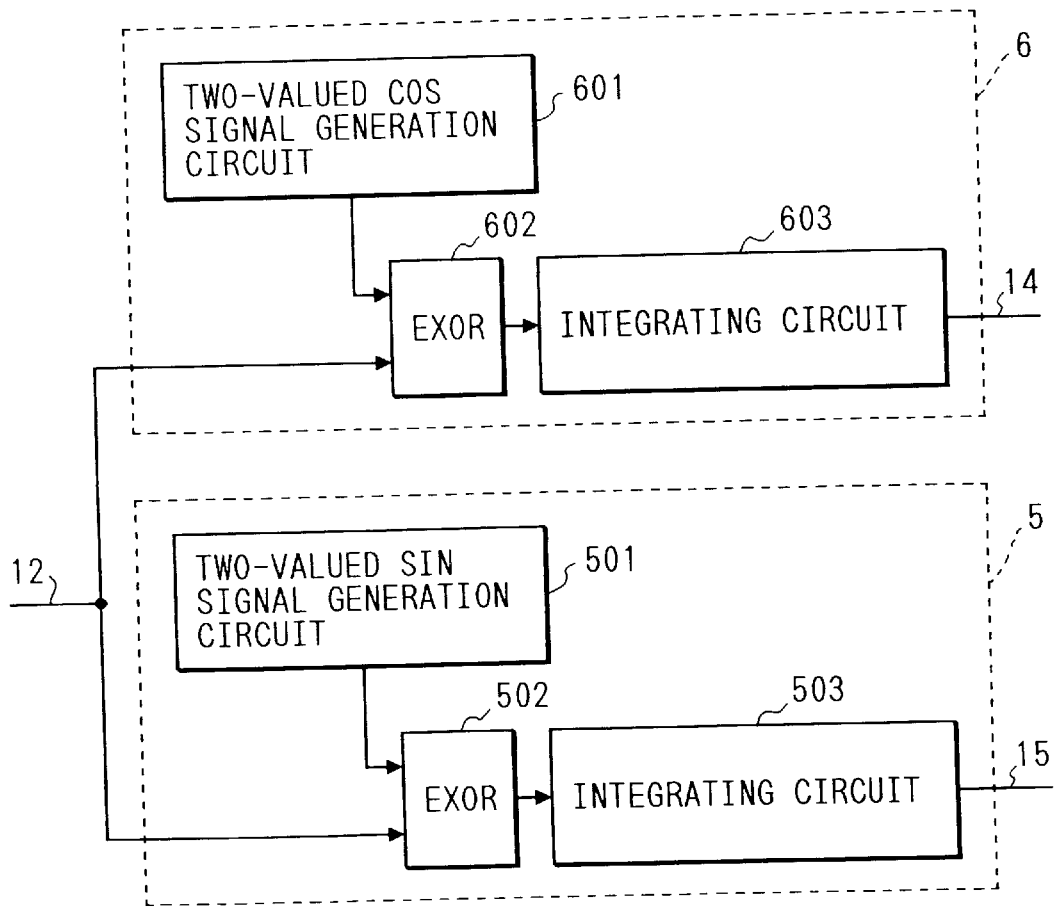
FIG. 6 is a diagram showing a construction of a correlation detection circuit in FIG. 4.

FIG. 6 is a block diagram showing a constructional example of the correlation detection circuit 4. In the correlation detection circuit 7, since the input data merely differs and its construction and operation are substantially the same as those of the correlation detection circuit 4, their detailed descriptions are omitted here.

In FIG. 6, modulation data 12 outputted from the modulation circuit 2 is supplied to EXOR circuits 502 and 602 in a sin correlation detection circuit 5 and a cos correlation detection circuit 6, respectively.

A two-valued sin signal generation circuit 501 generates the sin component in the pilot signal of the frequency (f) to be multiplexed to the EXOR circuit 502 as a two-valued rectangular wave signal. The EXOR circuit 502 gets the exclusive OR between the input data and the two-valued sin signal and outputs to an integrating circuit 503. The integrating circuit 503 sets bit "0" and bit "1" in the bit stream of 25 bits which are outputted from the EXOR circuit 502 to −1 and +1, respectively, and obtains the sum of the values of −1 and +1 of the bit stream and outputs to the selection circuit 11.

Figure 7:
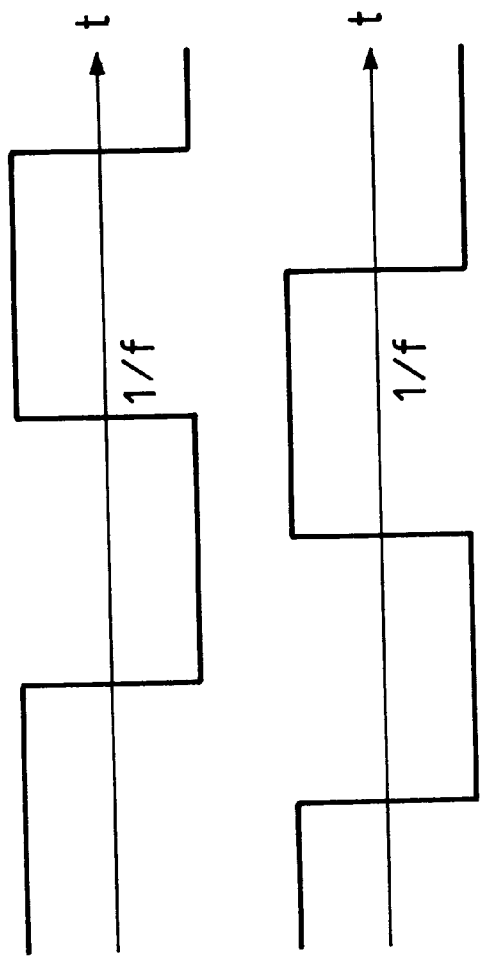
FIGS. 7A and 7B are diagrams showing states of a two-valued signal which is used in the circuit of FIG. 6.

A two-valued cos signal generation circuit 601 generates the cos component in the pilot signal of the frequency (f) to be multiplexed to the EXOR circuit 602 as a two-valued rectangular wave signal. The EXOR circuit 602 gets the exclusive OR between the input data and the two-valued cos signal and outputs it to an integrating circuit 603. In a manner similar to the integrating circuit 503, the integrating circuit 603 adds each bit of the bit stream outputted and outputs the resultant value to the selection circuit 11. FIGS. 7A and 7B are diagrams showing states of signals which are generated from the two-valued sin signal generation circuit 501 and two-valued cos signal generation circuit 602. FIG. 7A shows the two-valued sin signal. FIG. 7B shows the two-valued cos signal. As mentioned above, there is a phase deviation of 90° between those signals.

Since the correlation detection circuit 4 is constructed as mentioned above, when the two-valued sin signal and two-valued cos signal as signals of opposite phases are inputted as modulation signals, an output of the integrating circuit 503 is largest because the EXOR between the input data and each component signal is provided.

In the case where substantially the same signals as the two-valued sin signal and two-valued cos signal are inputted as modulation data, the output of the integrating circuit 503 is minimum.

Namely, the correlation detection circuit 4 obtains a correlation value between the two-valued signals shown in FIGS. 7A and 7B and the signal having the same frequency as that of the two-valued signals.

Addition signals 14 to 17 outputted from the correlation detection circuits 4 and 7 as mentioned above are supplied to the selection circuit 11. The selection circuit 11 controls the switch 3 on the basis of those signals and selectively outputs two kinds of modulation data.

Figure 8:
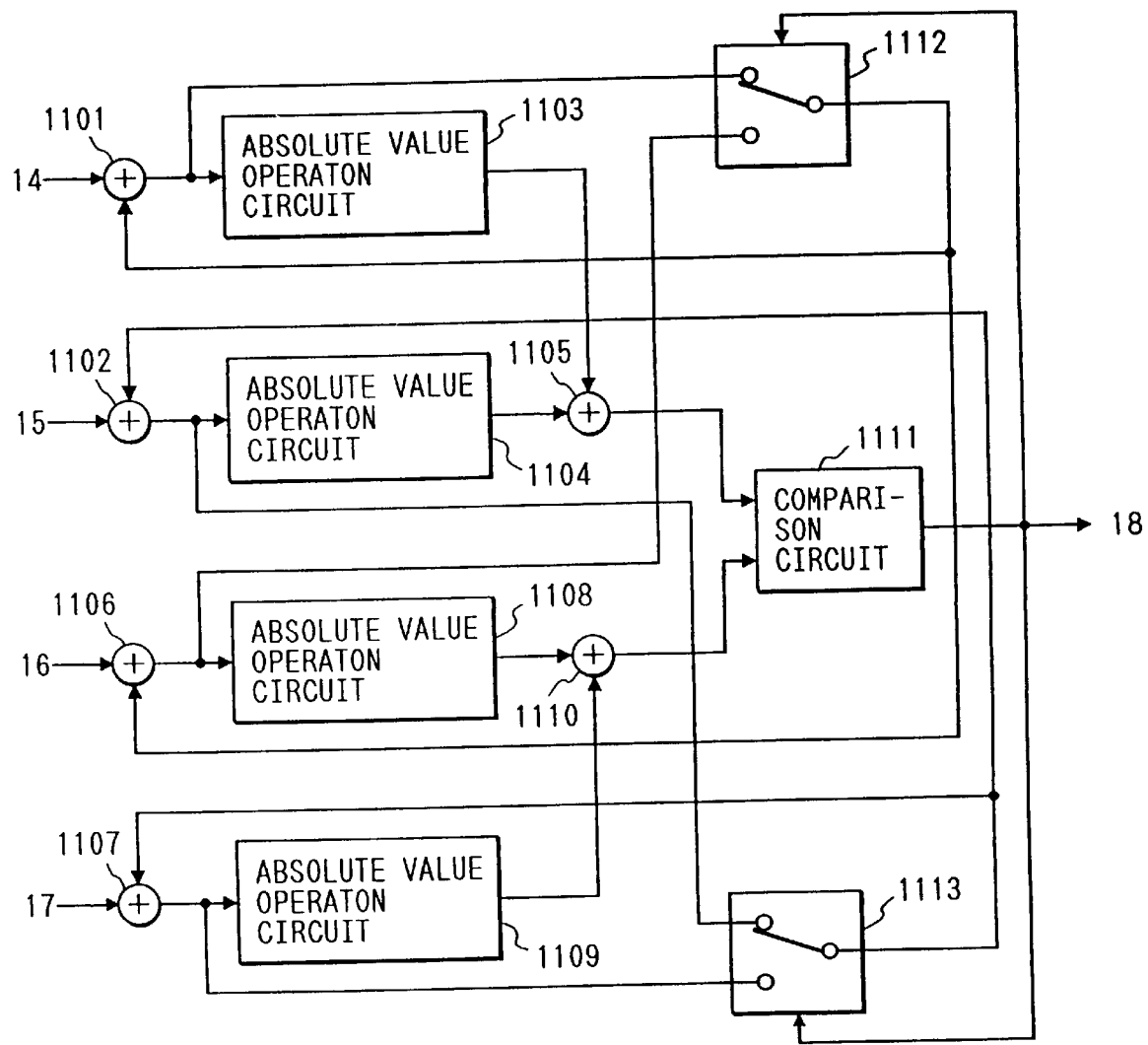
FIG. 8 is a diagram showing a construction of a selection circuit in FIG. 4.

FIG. 8 is a diagram showing a specific constructional example of the selection circuit 11. In FIG. 8, the addition result signals 14 and 15 outputted from the correlation detection circuit 4 are respectively supplied to adders 1101 and 1102. The adders 1101 and 1102 add career values which had already been calculated and were selected in the past to the input signals and output addition results to absolute value calculation circuits 1103 and 1104 and switches 1112 and 1113. The absolute value calculation circuits 1103 and 1104 calculate absolute values of the input data and supply them to an adder 1105. The adder 1105 adds those signals and outputs the addition result to a comparison circuit 1111.

The output signals 16 and 17 from the correlation detection circuit 7 are also similarly processed and are supplied to the switches 1112 and 1113 and comparison circuit 1111.

The comparison circuit 1111 compares the two inputted values and supplies a selection signal 18 indicative of the larger side (or smaller side) to the switches 1112 and 1113 and switch 3.

The switch 1112 is switched in accordance with the selection signal 18 and outputs the selected value to the adder 1101 and an adder 1106 as a career value of the sin component. The switch 1113 is switched in accordance with the selection signal 18 and outputs the selected value to the adder 1102 and an adder 1107 as a career value of the cos component. By adding the career value to each of the addition result signals 14 to 17, a bit stream to be outputted can be decided also with reference to the data selected in the past.

The switch 3 is switched in accordance with the selection signal 18 outputted as mentioned above and selectively outputs one of the two kinds of bit streams outputted from the modulation circuit 2.

A process such that the larger one of the input values is selected by the comparison circuit 1111 is nothing but a process such that a larger one of the absolute values of the integration values of outputs of the EXOR circuits 502 and 602 is selected. The modulation data that is closer to the frequencies of the signals shown in FIGS. 7A and 7B is selected.

Therefore, by constructing as mentioned above, the modulation data gradually has a high correlation with the pilot signal, so that the pilot signal of the frequency (f) can be multiplexed to the recording data.

Figure 9A:
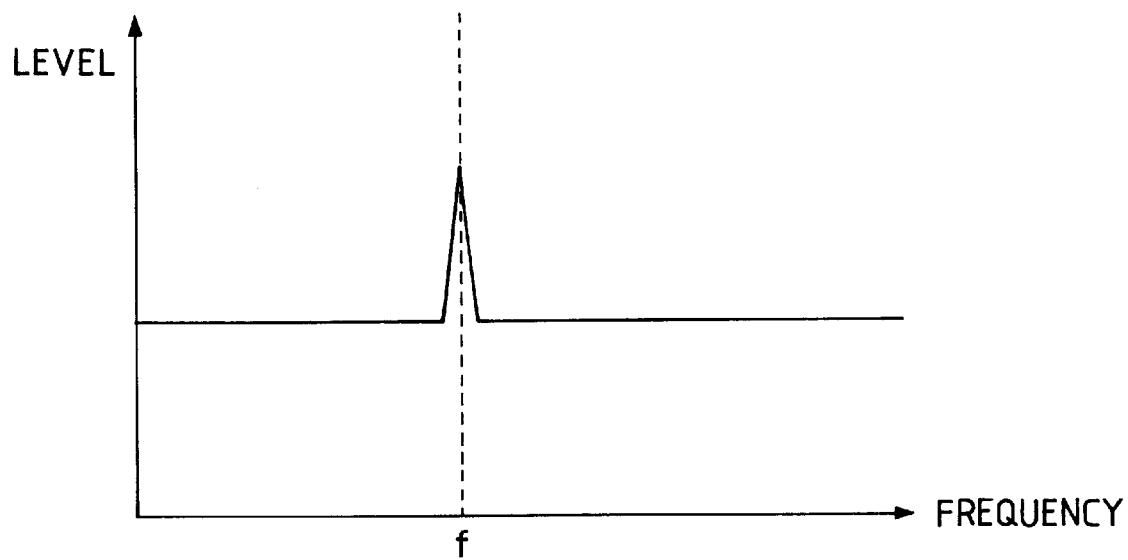
FIGS. 9A and 9B are diagrams showing states of frequency components of modulation data in the embodiment of the invention.
Figure 9B:
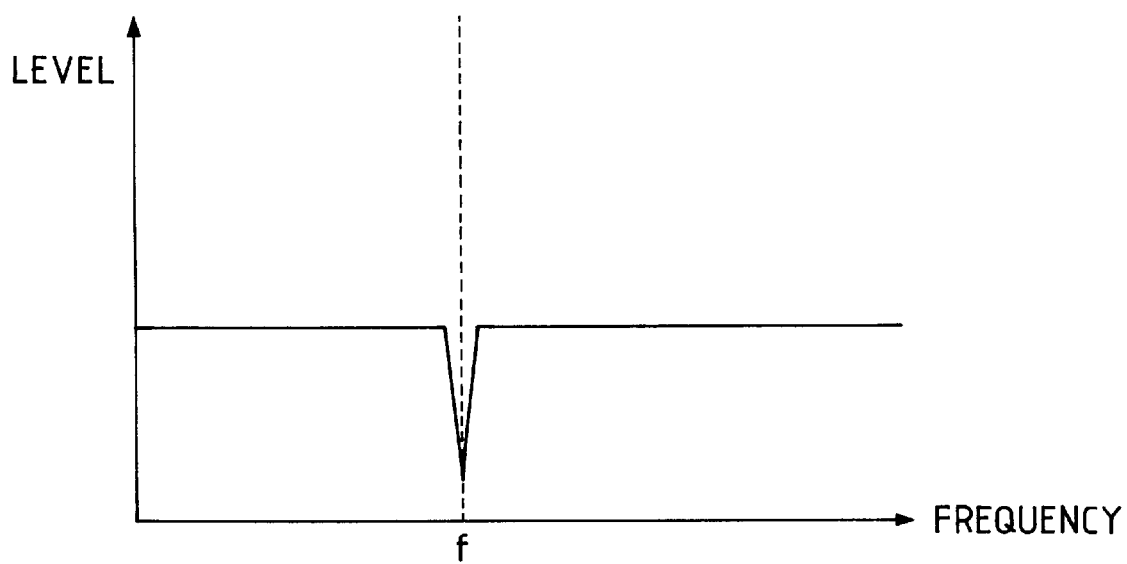

According to the construction such that the larger one of the input values is selected by the comparison circuit 1111 as mentioned above, as shown in FIG. 9A, the data can be modulated to the bit stream having a peak at the frequency (f) of the pilot signal in which the correlation was detected. By constructing the circuit so as to select the smaller one of the input values by the comparison circuit 1111, the data of a lower correlation is selected in a manner opposite to the above construction. The data can be modulated to the bit stream having a dip at the frequency (f) of the pilot signal as shown in FIG. 9B.

In the embodiment as mentioned above, when the correlation between the modulation data and the pilot signal to be recorded is detected, such a detection is performed on the basis of the results of the logical arithmetic operations between the modulation data and each of the two-valued sin signal and two-valued cos signal of the pilot signal. Therefore, the multiplication of multivalues is unnecessary and the multiplier and adder of large digit numbers are unnecessary. Thus, the circuit scale can be remarkably reduced.

Since the exclusive OR has been used as a logical arithmetic operation, different from the case of getting a simple multiplication (AND), a case where both of the modulation data and the two-valued signal of each component of the pilot signal are at the low level can be also detected (in case of AND, only a case where both of them are at the high level can be detected), the pilot signal component in the modulation data can be more accurately detected.

The embodiment has been described above with respect to the case where the pilot signal of the frequency (f) is multiplexed. In the digital VTR of the embodiment as mentioned above, an amount of each component of f1, f2, and DC has been adjusted. Therefore, the correlation value between the modulation data and each component is detected and the modulation has to be performed so as to set the amount of each component to a predetermined amount.

To adjust the amount of each component as mentioned above, it is sufficient to execute a similar operation with regard to each component. Namely, as mentioned above, the correlation values between the f1 and f2 components of the pilot signal and the DC component are detected with respect to the two kinds of modulation data, a predetermined coefficient is multiplied to each correlation value to thereby weight the correlation values, and the data is selected on the basis of those correlation values by the comparison circuit 1111, so that the amount of each component (balance between the height of peak of each component and the depth of dip) can be adjusted.

In this case, to detect the correlation value with the f1 component, it is sufficient to generate the sin component and cos component of the frequency f1 by the two-valued signal generation circuits 501 and 601, respectively. To detect the correlation value with the f2 component, it is sufficient to generate the sin component and cos component of the frequency f2, respectively. To detect the correlation value with the DC component, by integrating the input data as it is, the correlation value is detected.

In the embodiment, although the absolute value of each correlation value signal has been calculated in the comparison circuit 1111, a similar result is also derived by using a square arithmetic operating circuit.

The second embodiment of the invention will now be described.

Figure 10:
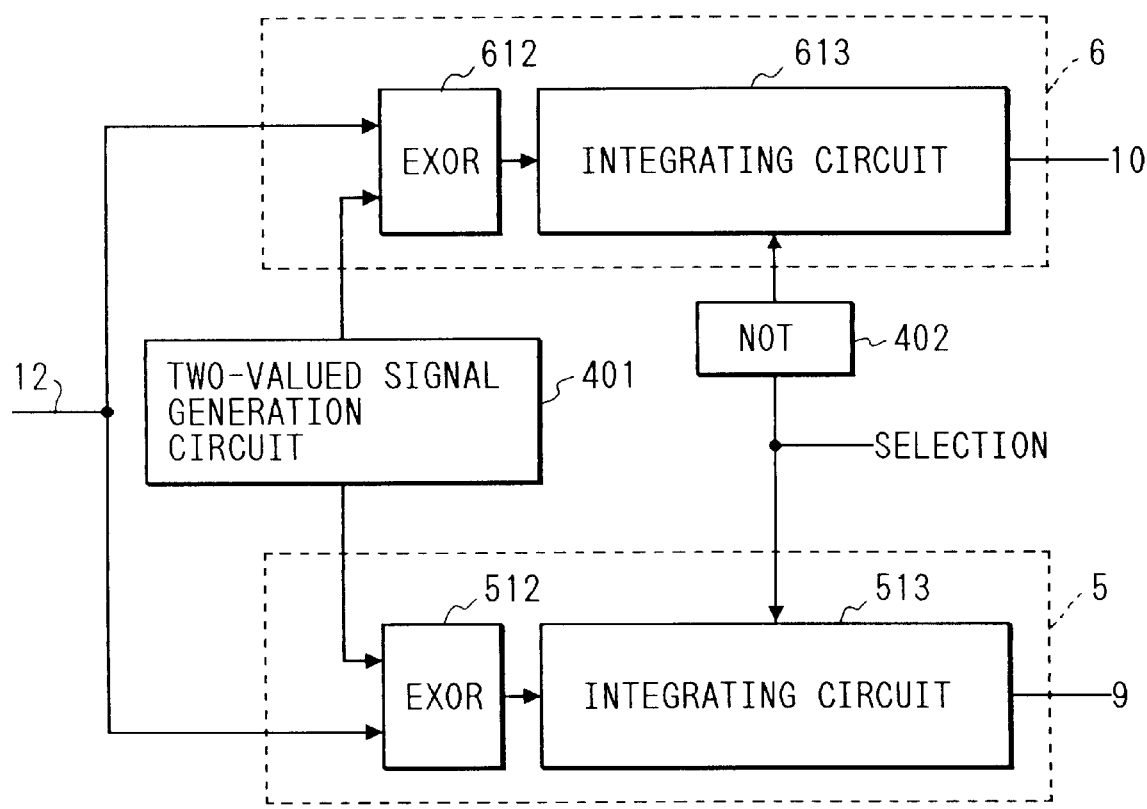
FIG. 10 is a diagram showing another construction of the modulation circuit in FIG. 2.

FIG. 10 is a block diagram showing a construction of the correlation detection circuit as a second embodiment.

In FIG. 10, the modulation data 12 is inputted to EXOR circuits 512 and 612 of the sin component detection circuit 5 and cos component detection circuit 6 in a manner similar to the foregoing embodiment. A two-valued signal generation circuit 401 generates the sin component in the pilot signal to be multiplexed to each of the EXOR circuits 512 and 612 by a two-valued rectangular wave signal.

The EXOR circuits 512 and 612 get the exclusive ORs between the input data and the two-valued signals generated from the two-valued signal generation circuits and output them to integrating circuits 513 and 613, respectively.

The integrating circuit 513 integrates an output of the EXOR circuit 512 when a selection signal outputted from a control circuit 10 is in a permitting state in accordance with the selection signal and outputs the integrated value. The integrating circuit 613 integrates an output of the EXOR circuit 612 when a signal obtained by inverting the selection signal by a NOT circuit 402 is in a permitting state and outputs the integrated value.

Figure 11A:
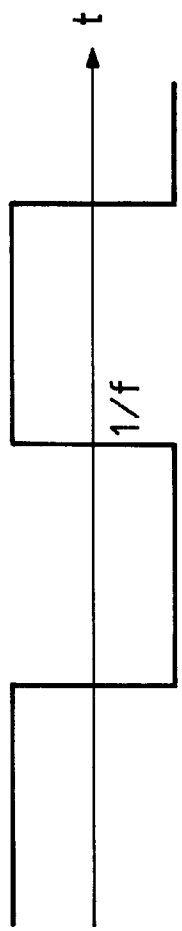
FIGS. 11A to 11D are diagrams showing states of signals which are used in the circuit of FIG. 10.
Figure 11B:
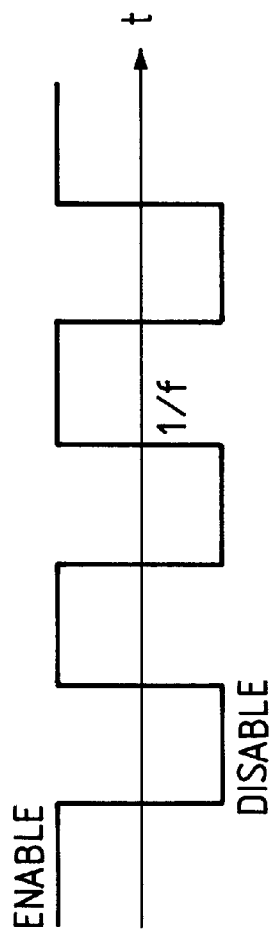

FIG. 11A shows a state of the two-valued signal which is generated from the two-valued signal generation circuit 401. FIG. 11B is a diagram showing a state of the selection signal which is outputted from the control circuit 10. As will be understood from the diagrams, the selection signal in the embodiment has a frequency that is just twice as high as the frequency of the two-valued signal which is generated from the two-valued signal generation circuit 401.

Figure 11C:
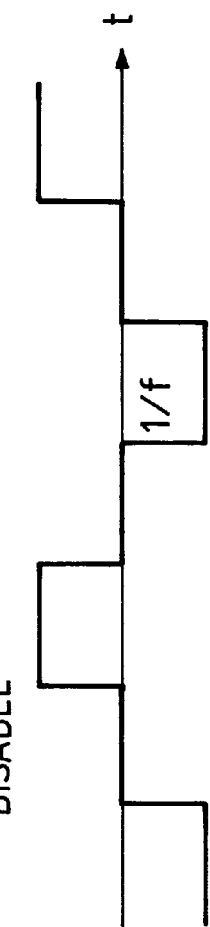
Figure 11D:
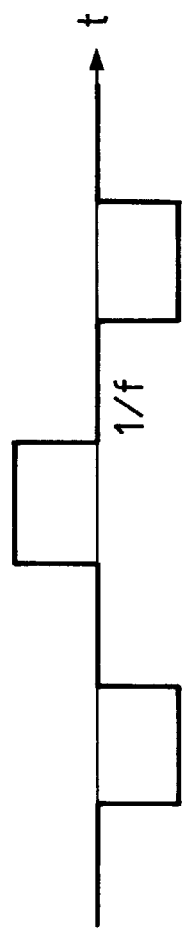

With the above construction, the correlation detection circuit 4 detects the correlation between the modulation data and a three-valued signal that is obtained by gating the two-valued signal which is generated from the two-valued signal generation circuit 401 by the selection signal. Figs. 11C and 11D show states of such a three-valued signal. Figs. 11C and 11D are nothing but the sin component and cos component of the pilot signal shown as three-valued rectangular wave signals. The integrating circuits 513 and 613 show the correlations with the sin component and cos component of the pilot signal, respectively. The subsequent operations are similar to those in the foregoing embodiment.

As described above, in the embodiment, by weight adding the exclusive OR between the two-valued signal and the modulation data in accordance with the selection signal, the correlation with the signal in which the sin component and cos component of the pilot signal are expressed by the three-valued signal is detected. The pilot signal component in the modulation data, therefore, can be detected by a simple construction. The multiplier of a large digit number is also unnecessary. Since the correlation with the three-valued signal is detected, as compared with the foregoing two-valued signal, the pilot signal component in the modulation data can be more accurately detected.

Figure 12:
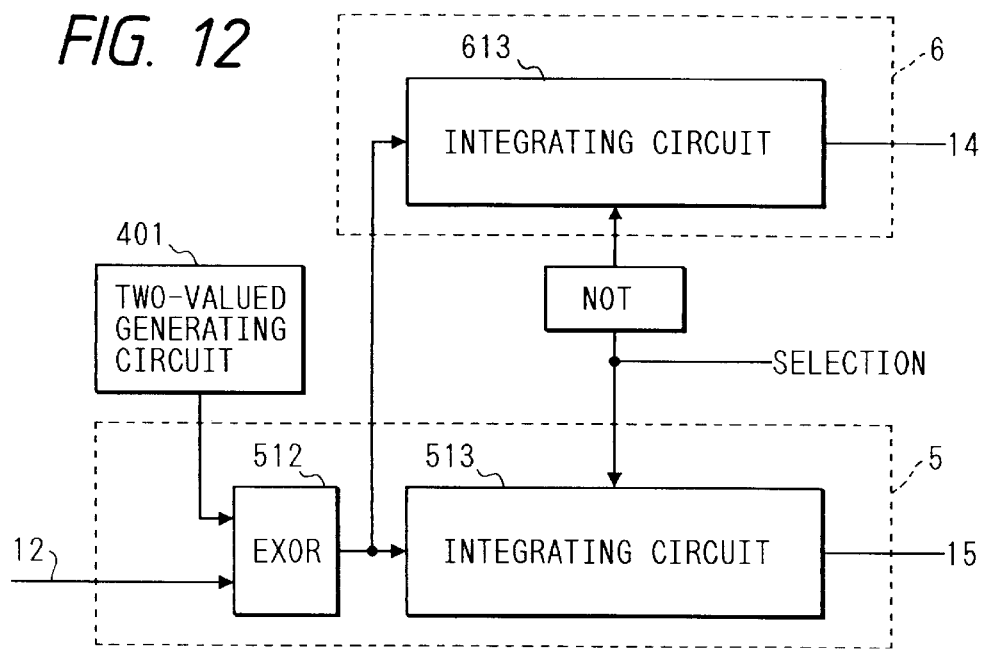
FIG. 12 is a diagram showing still another construction of the modulation circuit in FIG. 2.

FIG. 12 shows a constructional example of another circuit to detect the correlation value with the three-valued signal. In FIG. 12, only one EXOR circuit is provided and the result of the EXOR between the two-valued signal and the input data is integrated in accordance with the selection signal, thereby detecting the correlation value. By constructing the circuit as shown in FIG. 12, it is sufficient to use only one EXOR circuit.

Figure 13:
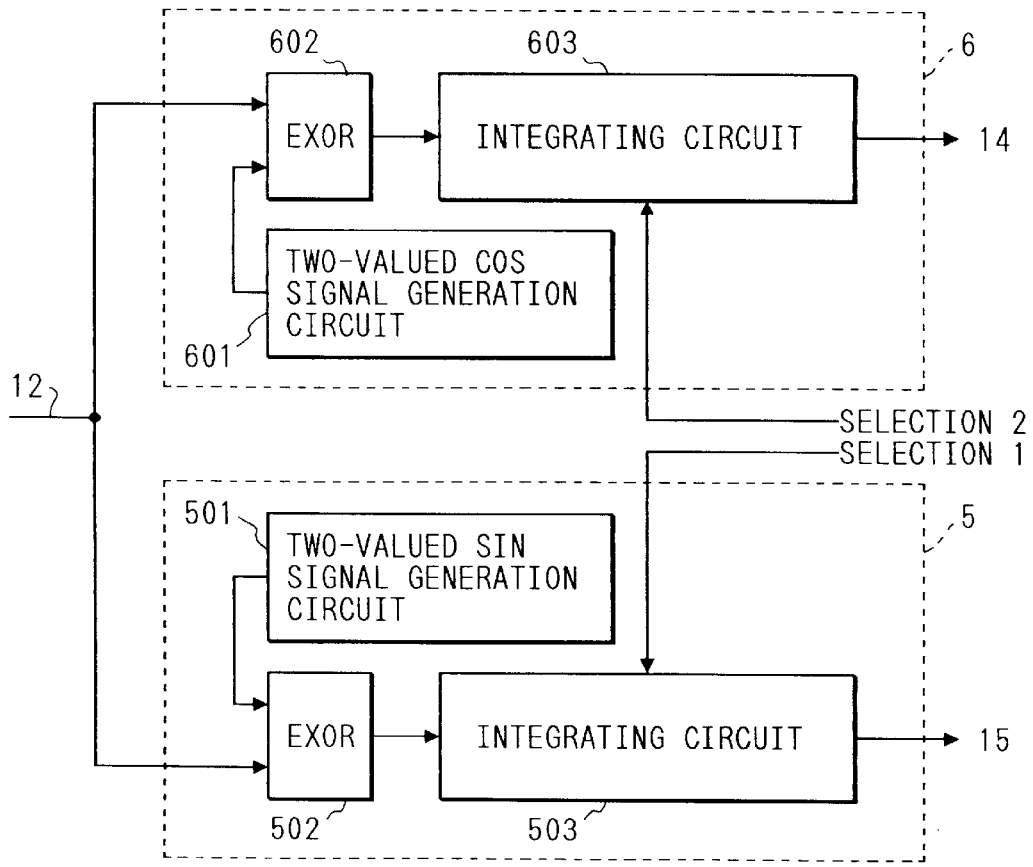
FIG. 13 is a diagram showing another construction of the modulation circuit in FIG. 2.

FIG. 13 is a diagram showing a constructional example of another circuit to detect a correlation value with the three-valued signal. In FIG. 13, the two-valued signal generation circuits 501 and 601 generate two-valued signals shown in FIGS. 14A and 14B, respectively. Phases of those two-valued signals differ by 90° in a manner similar to the foregoing embodiment. In the circuit of FIG. 13, the outputs of the EXOR circuits 502 and 602 are integrated in accordance with selection signals shown in FIGS. 14C and 14D, thereby detecting the correlation values, respectively.

Thus, the outputs of the integrating circuits 503 and 603 show the correlations with the three-valued signals shown in FIGS. 14E and 14F. In the above construction, since the two-valued signal and the selection signal are used with respect to each of the sin component and the cos component, the state of the three-valued signal to obtain the correlation can be finely controlled. The optimum three-valued signal can be formed in accordance with the pilot signal to be detected.

The third embodiment of the invention will now be described.

Figure 15:
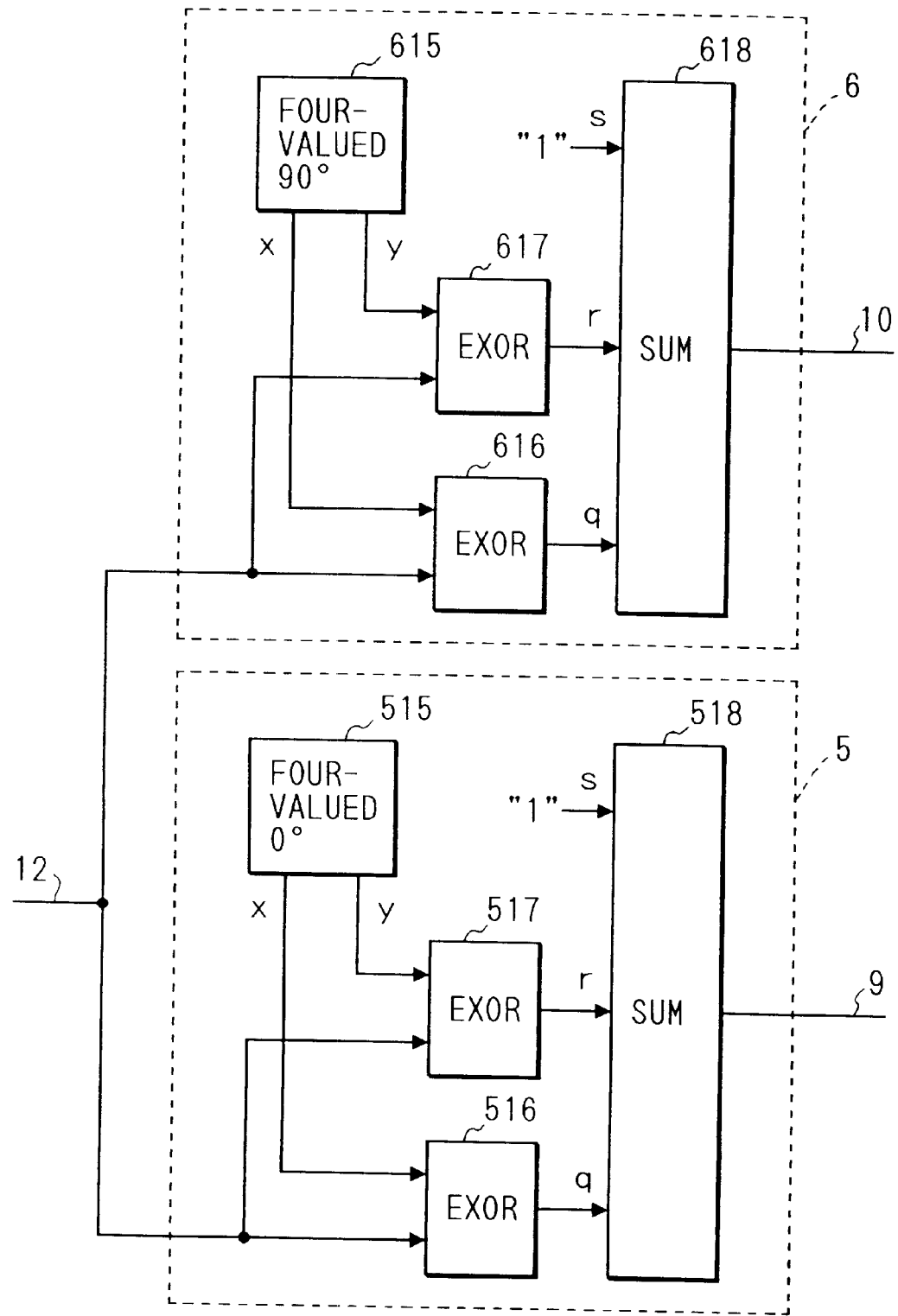
FIG. 15 is a diagram showing another construction of the modulation circuit in FIG. 2.

FIG. 15 is a block diagram showing a construction of the correlation detection circuit 4 as a third embodiment. In FIG. 15, the modulation data 12 is outputted to EXOR circuits 516 and 517 and EXOR circuits 616 and 617, respectively.

A four-valued signal generation circuit 515 generates the sin component in the pilot signal to be multiplexed as two two-valued signals (x) and (y) and supplies them to the EXOR circuits 516 and 517, respectively. FIGS. 16A and 16B show states of those two-valued signals.

The EXOR circuits 516 and 517 calculate the exclusive ORs between the input data and the two-valued signals and output them to an integrating circuit 518. The integrating circuit 518 integrates two-valued signals (q) and (r) which are supplied from the EXOR circuits 516 and 517 and a signal (s) which is outputted in a state in which "1" is fixedly outputted as data of three bits which are arranged like "qrs" from the upper bit and outputs such three-bit data. In the embodiment, the three-bit data which is outputted to the integrating circuit 518 shows a complementary number expression of 2 in which the signal (q) is used as a sign. Therefore, an output (9) detected as mentioned above shows a correlation value between a four-valued signal shown in FIG. 16C and the modulation data.

With respect to the cos component as well, two two-valued signals whose phases are different from the phase of the sin component by 90° as shown in FIGS. 16D and 16E are generated by a four-valued signal generation circuit 615. Outputs of the EXOR circuits 616 and 617 are integrated, thereby obtaining correlation values.

According to the embodiment as described above, the sin component and cos component of the pilot signal are used as two two-valued rectangular wave signals and logical arithmetic operations between those signals and the input data are executed, thereby obtaining the correlation value with the four-valued signal of each component. Therefore, in spite of the fact that the pilot signal can be further efficiently multiplexed as compared with the case of the foregoing embodiment, a multiplier of a large digit number is unnecessary.

Although the above embodiment has been described until the case of obtaining the correlation value with the four-valued signal, the pilot signal component in the input data can be also detected by obtaining a correlation value between the input data and an n-valued (n is an integer of 2 or more) signal as another method. In such a case, as the value of (n) increases, the number of EXOR circuits which are used also increases.

In each of the embodiments of the invention as described above, the exclusive ORs between the modulation data and the signals in which the sin and cos components of the pilot signal are expressed by two-valued rectangular waves are calculated and the correlation value with the signal in which each component of the pilot signal is expressed by a multivalue is obtained on the basis of the results of the exclusive ORs, thereby detecting the pilot signal component in the input data.

Therefore, the pilot component in the input data can be detected by only the simple logical arithmetic operation and the pilot signal of a specific frequency can be multiplexed to the input data by a simple circuit.

As will be obviously understood from the above description, the specific frequency component in the modulation data is detected by the logical arithmetic operation between the modulation data and the two-valued signal and the modulating means is controlled on the basis of the detection result. Thus, the specific frequency component in the modulation data can be detected by the simple construction. For example, the amount of specific frequency component in the modulation data can be adjusted.

What is claimed is:

1. A data processing devices, comprising:
   (a) modulating means for modulating input data;
   (b) generating means for generating a two-valued signal corresponding to a signal having a specific frequency component;
   (c) operating means for receiving the modulated data from said modulating means and the two-valued signal from said generating means, and for performing a logical operation between the modulated data and the two-valued signal;
   (d) detecting means for detecting a correlation between the modulated data and the two-valued signal in accordance with the logical operation output of the operating means, and for outputting a correlation detection result corresponding to the detected correlation; and
   (e) control means for controlling a modulating operation of said modulating means in accordance with the correlation detection result of said detecting means.

2. A device according to claim 1, wherein said modulating means adds control data of one bit to input data of (n) bits and modulates said input data so that at least partial data in said n-bit input data has an opposite relation in accordance with whether said control data is equal to "0" or "1".

3. A device according to claim 1, wherein said modulating means adds control data of one bit to input data of (n) bits and, after that, executes an interleaved NRZI conversion to data of (n+1) bits.

4. A device according to claim 3, wherein said modulating means has selecting means for selectively outputting either one of said data of (n+1) bits to which "1" is added as said control data and said data of (n+1) bits to which "0" is added,
   and wherein said control means controls the selecting operation of said selecting means in accordance with an output of said detecting means.

5. A device according to claim 1, wherein said detecting means has means for detecting a correlation with a multi-value signal regarding the signal having said specific frequency in accordance with the output of said operating means.

6. A device according to claim 1, wherein said operating means executes an exclusive OR operation.

7. A device according to claim 1, wherein said control means controls the operation of said modulating means so that said specific frequency component is included as much as possible in the output of said modulating means.

8. A device according to claim 1, wherein said control means controls the operation of said modulating means so that said specific frequency component is included as little as possible in the output of said modulating means.

9. A device according to claim 1, wherein said modulating means modulates the input signal by using a control signal of one bit, and wherein said operating means includes (i) means for generating first modulation data modulated by using the bit "1" as the control data, and second modulation data modulated by using the bit "0" as the control data, and (ii) selection means for selectively outputting said first modulation data and said second modulation data.

10. A device according to claim 9, wherein said operation means includes (i) a first operating unit for performing a logical operation between said first modulation data and the two-valued signal and outputting a first operation result, and (ii) a second operating unit for performing a logical operation between said second modulation data and the two-valued signal and outputting a second operation result.

11. A device according to claim 10, wherein said detecting means includes (i) a first accumulation unit for accumulating the first operation result output from said first operating unit, and (ii) a second accumulation unit for accumulating the second operation result output from said second operating unit, and wherein said detecting means controls the modulating operation of said modulating means according to an accumulation result of said first accumulation unit and an accumulation result of said second accumulation unit.

12. A device according to claim 11, wherein said control means compares the accumulation result of said first accumulation unit and the accumulation result of said second accumulation unit and controls said selecting means so as to output the first modulation data when the accumulation result of said first accumulation unit is greater than that of said second accumulation unit.

13. A device according to claim 11, wherein said control means compares the accumulation result of said first accumulation unit and the accumulation result of said second accumulation unit and controls said selecting means so as to output the second modulation data when the accumulation result of said second accumulation unit is greater than that of said first accumulation unit.

14. A device according to claim 1, wherein said generating means generates a first two-valued signal and a second two-valued signal whose phase is different from that of the first two-valued signal based on a four-value signal associated with the specific frequency component, and
   wherein said operating means includes a first operating unit for performing a logical operation between the modulated data and the first two-valued signal, and a second operating unit for performing a logical operation between the modulated data and the second two-valued signal.

15. A device according to claim 1, wherein said detecting means includes accumulating means for intermittently accumulating an operation result output from said operation means.

16. A digital data recording apparatus comprising:
   (a) modulation means for modulating input digital data;
   (b) generating means for generating a first two-valued signal regarding a first reference signal having a first frequency and a second two-valued signal regarding a second reference signal having a second frequency different from said first frequency;
   (c) operating means for receiving the modulated digital data supplied from said modulation means and the first and second two-valued signals to execute a logical operation between the modulated signal data and the first two-valued signal and to execute the logical operation between the modulated digital data and the second two-valued signal;
   (d) control means for receiving the logical operation result from said operating means to detect first and second frequency components in the modulated digital data output by said modulation means in accordance with the logical operation result; and
   (e) recording means for forming a plurality of tracks onto a recording medium and for recording the modulated digital signal modulated by said modulation means,
      wherein said recording means records the modulated signal so that the plurality of tracks include a track on which the modulated digital data which includes the first frequency component is recorded, and a track on which the modulated digital data which includes the second frequency component is recorded.

17. An apparatus according to claim 16, wherein said modulator adds control data of one bit to input data of (n) bits and, after that, executes an interleaved NRZI conversion to data of (n+1) bits.

18. An apparatus according to claim 16, wherein said operating means executes an exclusive OR operation.

19. A data processing device, comprising:

(a) generating means for generating a two-valued signal corresponding to a signal of a specific frequency;

(b) operating means for receiving modulated data and the two-valued signal supplied from said generating means, and for executing a logical operation between the modulated data and the two-valued signal; and (c) detecting means for detecting a correlation between the modulated data and the two-valued signal according to the logical operation output of said operation means, and for outputting a correlation detection result corresponding to the detected correlation.

20. A device according to claim 19, wherein said generating means generates a plurality of the two-valued signals, and said operating means executes said logical operations among a first two-valued signal, a second two-valued signal whose phase differs from the phase of said first two-valued signal by 90°, and said input data, respectively.

21. A device according to claim 19, wherein said detecting means has:

accumulating means for accumulating an output of said operating means every predetermined number of bits; and absolute value detecting means for detecting an absolute value of an output of said accumulating means.

22. A device according to claim 19, wherein said two-valued signal includes first and second two-valued signals each having a period of said specific frequency, said operating means has a first circuit for executing the logical arithmetic operation between said first two-valued signal and said input data and a second circuit for executing the logical operation between said second two-valued signal and said input data, and said detecting means has a circuit for weight adding an output of said first circuit and an output of said second circuit.

23. A device according to claim 19, wherein said detecting means has a circuit for weight-adding the output of said operating means in accordance with a control signal having a period that is integer times as high as a period of said two-valued signal.

24. A data processing method comprising the steps of:

(a) modulating input data;

(b) generating a two-valued signal corresponding to a signal having a specific frequency component;

(c) receiving the modulated data supplied from said modulating step and the two-valued signal supplied from said generating step and performing a logical operation between the modulated data and the two-valued signal;

(d) detecting a correlation between the modulated data and the two valued signal in accordance with the logical operation output of said performing operation and providing a correlation detection result corresponding to the detected correlation; and (e) controlling a modulating operation of said modulating step in accordance with the correlation detection result.

25. A method according to claim 24, wherein said modulating step adds control data of one bit to input data of (n) bits and modulates said input data so that at least partial data in the n-bit input data has an opposite relation in accordance with whether said control data is equal to "0" or "1".

26. A method according to claim 24, wherein said modulating step adds control data of one bit to input data of (n) bits and, after that, executes an interleaved NRZI conversion to data of (n+1) bits.

27. A method according to claim 26, wherein said modulating step includes a selecting step of selectively outputting either one of (i) said data of (n+1) bits to which "1" is added as said control data and (ii) said data of (n+1) bits to which "0" is added, and wherein the controlling portion of said receiving (e) step controls the selecting operation of said selecting step in accordance with an output of the detecting portion of said receiving (d) step.

28. A method according to claim 24, wherein the detecting portion of said receiving (d) step includes a step of detecting a correlation with a multivalue signal regarding the signal having the specific frequency component in accordance with an output of the performing portion of said receiving (c) step.

29. A method according to claim 24, wherein said performing portion of said receiving (c) step executes an exclusive OR operation.

30. A method according to claim 24, wherein said controlling portion of said receiving (e) step controls the operation of said modulating step so that the specific frequency component is included in the output data of said modulating step.

31. A method according to claim 24, wherein the performing portion of said receiving (c) step modulates the input signal by using a control signal of one bit, and wherein said receiving (c) step includes a step of generating first modulation data modulated by using the bit "1" as the control data, and second modulation data modulated by using the bit "0" as the control data, and further comprising a selection step of selectively outputting said first modulation data and said second modulation data.

32. A method according to claim 31, wherein said performing portion of said receiving (c) step includes a first operating step of performing a logical operation between said first modulation data and the two-valued signal and outputting a first operation result, and a second operating step of performing a logical operation between said second modulation data and the two-valued signal and outputting a second operation result.

33. A method according to claim 32, wherein the detecting portion of said receiving (d) step includes a first accumulation step of accumulating the first operation result output from said first operating step, and a second accumulation step of accumulating the second operation result from said second operating step, and wherein the detecting portion of said receiving (d) step controls the modulating operation of said modulating step according to an accumulation result of said first accumulating step and an accumulation result of said second accumulating step.

34. A method according to claim 33, wherein said controlling portion of said receiving (e) step compares the accumulation result of said first accumulation step and the accumulation result of said second accumulation step and controls said selection step so as to output the first modulation data when the accumulation result of said first accumulation step is greater than that of said second accumulation step.

35. A method according to claim 33, wherein the controlling portion of said receiving (e) step compares the accumulation result of said first accumulation step and the accumulation result of said second accumulation step and controls said step selection so as to output the second modulation data when the accumulation data of said second second accumulation step is greater than that of said first accumulation step.

36. A method according to claim 24, wherein said generating step generates a first two-valued signal and a second two-valued signal whose phase is different from that of the first two-valued signal, based on a four-valued signal associated with the specific frequency component, and wherein the performing portion of said receiving (c) step includes a first operating step of performing a logical operation between the modulated data and the first two-valued signal, and a second operating step for performing a logical operation between the modulated data and the second two-valued signal.

37. A method according to claim 24, wherein the detecting portion of said receiving (d) step includes an accumulating step of intermittently accumulating an operation result from the performing portion of said receiving (c) step.

38. A data processing devices comprising:

modulation means for modulating input data to obtain a plurality of modulated data having different modulation results from each other;

generating means for generating a two-value signal corresponding to a signal having a specific frequency component;

operating means for receiving the plurality of modulated data from said modulation means and the two-valued signal from said generating means, and for performing a logical operation between each of the plurality of modulated data and the two-valued signal, said operating means providing a plurality of logical operation results;

detecting means for detecting a correlation between each of the plurality of modulated data and the two-valued data in accordance with the plurality of logical operation results from said operation means, and for providing a correlation detection result corresponding to the detected correlation; and control means for selectively outputting the plurality of modulated data according to the correlation detection result provided by said detecting means.

39. A device according to claim 1, wherein said control means controls the modulating operation of said modulating means to vary an amount of the specific frequency component contained in the modulated data.

* * * * *

UNITED STATES PATENT AND TRADEMARK OFFICE
CERTIFICATE OF CORRECTION

PATENT NO. : 5,898,531
DATED : April 27, 1999
INVENTOR(S) : SHINGO NOZAWA

It is certified that error appears in the above-indentified patent and that said Letters Patent is hereby corrected as shown below:

On the title page:

At [56] References Cited

"Fitzpatrick, Cella Harper & Scinto" should read --Fitzpatrick, Cella, Harper & Scinto--.

At [73] Assignee

"Cannon Kabushiki Kaisha," should read --Canon Kabushiki Kaisha,--.

Column 4

Line 48, "circuit 11." should read --circuit 11. ¶--.

Column 9

Line 5, "devices," should read --device,--.
Line 44, "quency" should read --quency component--.

UNITED STATES PATENT AND TRADEMARK OFFICE
CERTIFICATE OF CORRECTION

PATENT NO.   : 5,898,531
DATED        : April 27, 1999
INVENTOR(S)  : SHINGO NOZAWA It is certified that error appears in the above-indentified patent and that said Letters Patent is hereby corrected as shown below:

<u>Column 11</u>

Line 45, "weight adding" should read --weight-adding--.
    Line 64, "two valued" should read --two-valued--.

<u>Column 13</u>

Line 7, "second" should be deleted.
    Line 24, "devices" should read --device,--.

Signed and Sealed this

Ninth Day of November, 1999

Attest:

Q. TODD DICKINSON

*Attesting Officer*   *Acting Commissioner of Patents and Trademarks*